(12) United States Patent
Yamazawa (10) Patent No.: US 7,737,706 B2
(45) Date of Patent: Jun. 15, 2010

(54) METHOD AND APPARATUS FOR INSPECTING PROCESS PERFORMANCE FOR USE IN A PLASMA PROCESSING APPARATUS

(75) Inventor: Yohei Yamazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 348 days.

(21) Appl. No.: 11/961,254

(22) Filed: Dec. 20, 2007

(65) Prior Publication Data

US 2008/0174324 A1 Jul. 24, 2008

Related U.S. Application Data

(60) Provisional application No. 60/907,398, filed on Mar. 30, 2007.

(30) Foreign Application Priority Data

Jan. 24, 2007 (JP) .............................. 2007-013577

(51) Int. Cl.
*G01R 27/08* (2006.01)
*G01N 27/62* (2006.01)
(52) U.S. Cl. .................... 324/707; 324/464; 156/345.24
(58) Field of Classification Search ................ 324/707, 324/464; 156/345.24
See application file for complete search history.

(56) References Cited

U.S. PATENT DOCUMENTS 6,424,232 B1 * 7/2002 Mavretic et al. ........... 333/17.3
6,929,712 B2 * 8/2005 Hanazaki et al. ....... 156/345.24

FOREIGN PATENT DOCUMENTS

JP 2002-124400 4/2002
JP 2005-109183 4/2005

* cited by examiner

*Primary Examiner*—Timothy J Dole
(74) *Attorney, Agent, or Firm*—Oblon, Spivak, McClelland, Maier & Neustadt, L.L.P.

(57) ABSTRACT

A method inspects a process performance of a capacitively coupled plasma processing apparatus which generates a plasma for a plasma processing by applying a radio frequency power between a first electrode and a second electrode disposed in a processing vessel to face the first electrode in parallel. The method includes measuring an impedance of a radio frequency transmission path ranging from a rear surface of the first electrode to a ground potential part and sweeping a frequency to thereby obtain a frequency characteristic of a real resistance component of the impedance; reading a specific property value of a horn-like peak which appears from the frequency characteristic of the real resistance component; and determining efficaciousness or inferiority of the process performance of the plasma processing apparatus based on the peak property value.

15 Claims, 6 Drawing Sheets

| APPARATUS | PEAK FREQUENCY (MHz) | Vpp (V) | Vpp DETERMINATION |
|---|---|---|---|
| A | 13.95 | 1283 | ABNORMAL |
| B | 13.75 | 1058 | ABNORMAL |
| C | 13.7 | 1849 | NORMAL |
| D | 13.65 | 1852 | NORMAL |
| E | 13.6 | 1851 | NORMAL |
| F | 13.55 | 1854 | NORMAL |
| G | 13.5 | 1851 | NORMAL |

METHOD AND APPARATUS FOR INSPECTING PROCESS PERFORMANCE FOR USE IN A PLASMA PROCESSING APPARATUS

FIELD OF THE INVENTION

The present invention relates to a method and apparatus for inspecting a process performance for use in a plasma processing apparatus; and, more particularly, to a method and apparatus for evaluating a process performance of a capacitively coupled plasma processing apparatus.

BACKGROUND OF THE INVENTION

Generally, a capacitively coupled plasma processing apparatus includes an upper electrode and a lower electrode disposed parallel to each other in a depressurizable processing vessel configured as a vacuum chamber, wherein a target substrate (e.g., a semiconductor wafer, a glass substrate, etc.) is mounted on the lower electrode. Electrons are accelerated by an electric field formed by a radio frequency voltage applied between the upper and the lower electrode and are made to collide with a processing gas. As a result of ionization by the collision between the electrons and the processing gas, a plasma is generated, and a desired process (for example, etching, deposition, oxidation, sputter, etc.) is performed on the surface of the substrate by radicals or ions in the plasma. Typically, a coaxial cable is used as a radio frequency power supply line through which the radio frequency power outputted from a radio frequency power supply is supplied to the electrode inside the chamber. A matching circuit is attached to an end of the coaxial cable. This matching circuit is an LC circuit which serves to match an impedance of the plasma (load) to that of the radio frequency power supply. The matching circuit has a single or plural variable capacitors therein and functions to control the capacity of variable reactance so as to minimize a reflection wave from the plasma (see, for example, Japanese Patent Laid-open Application No. 2005-109183).

Recent researches have found that, in the aforementioned capacitively coupled plasma processing apparatus, an impedance of a radio frequency transmission path, which ranges from a front surface (a surface in contact with the plasma) of an ungrounded electrode to a ground potential via the ungrounded electrode, is an important factor that determines an generation amount of harmonic waves or intermodulation distortion. Besides, it is also found that this impedance of the radio frequency transmission path influences a process performance. According to these researches, it is preferable to design each component of the apparatus, particularly, a radio frequency power supply system, such that the impedance of the radio frequency transmission path is of an optimum value or within an optimum range. However, in practice, there frequently occurs a mechanical difference in the radio frequency power supply system between apparatuses (particularly, the mechanical difference is likely to occur due to a difference in the length of the RF cable, the circuit constant of the matching circuit, or the like), and such mechanical difference in the radio frequency power supply system has a great influence on the impedance of the radio frequency transmission path.

In view thereof, a use of an inspection method is under consideration wherein the method involves directly measuring the impedance of the radio frequency transmission path by means of installing a jig of a impedance measuring unit on the electrode front surface inside the chamber in each apparatus; and making a determination that the process performance is normal (good) if the impedance value is within a specific range or that the process performance is abnormal (bad) if the impedance is out of the range. This inspection method does not necessitate plasma ignition or plasma generation, so it can be performed when shipping the apparatus or installing the apparatus at a target place. In the capacitively coupled plasma processing apparatus, however, the electrode front surface, which is in contact with the plasma while radiating radio frequency waves, is the most important part on the process and is the most vulnerable part as well. Therefore, installing the jig on this part is not preferable in the aspect of protecting electrodes and preventing particle generation.

SUMMARY OF THE INVENTION

In view of the foregoing, the present invention provides a method and apparatus for inspecting a process performance for use in a capacitively coupled plasma processing apparatus, capable of simply determining whether the process performance would be good or bad without generating a plasma and installing a jig on an electrode surface.

In accordance with a first aspect of the present invention, there is provided a method for inspecting a process performance of a capacitively coupled plasma processing apparatus which generates a plasma for a plasma processing by applying a radio frequency wave between a first electrode attached to a depressurizable processing vessel and a second electrode disposed in the processing vessel to face the first electrode in parallel, the first electrode being ungrounded. The method includes: a first step of measuring an impedance of a radio frequency transmission path ranging from a rear surface of the first electrode to a ground potential part and sweeping a frequency to thereby obtain a frequency characteristic of a real resistance component of the impedance; a second step of reading a value of a specific property of a horn-like peak which appears from the frequency characteristic of the real resistance component; and a third step of determining adequacy or inadequacy of the process performance of the plasma processing apparatus based on the value of the property of the peak.

Further, in accordance with a second aspect of the present invention, there is provided an apparatus for inspecting a process performance of a capacitively coupled plasma processing apparatus which generates a plasma for a plasma processing by applying a radio frequency wave between a first electrode attached to a depressurizable processing vessel and a second electrode disposed in the processing vessel to face the first electrode in parallel, the first electrode being ungrounded. The apparatus includes: an impedance measuring unit for measuring an impedance of a radio frequency transmission path ranging from a rear surface of the first electrode to a ground potential part; a real resistance component frequency characteristic acquiring unit for acquiring a frequency characteristic of a real resistance component of the impedance by allowing the impedance measuring unit to measure the impedance of the radio frequency transmission path while sweeping a frequency; a peak reading unit for reading a value of a specific property of a peak which appears from the frequency characteristic of the real resistance component; and a determination unit for determining adequacy or inadequacy of the process performance of the plasma processing apparatus based on the value of the property of the peak.

In accordance with the aspects of the present invention, a frequency characteristic of a real resistance component (real part) of the impedance of a radio frequency transmission path ranging from a rear surface of the first electrode to a ground potential part is obtained. Then, a value of a specific property of a horn-like peak (for example, a peak frequency or a peak value) which appears from the frequency characteristic of the real resistance component is obtained. The value of the property of the peak reflects a characteristic of the impedance or a mechanical difference of the radio frequency transmission path and can be a parameter of determining whether the process performance would be good or bad. In inspecting the process performance in accordance with the aspects of the present invention, it is not required to ignite or generate a plasma since measuring an impedance is enough, and a front surface of the electrode is not damaged since a probe (measuring jig) of an impedance measuring unit is installed on the backside of the electrode.

Preferably, when the plasma processing is performed in the plasma processing apparatus, a first radio frequency wave is supplied to the first electrode from a first radio frequency power supply via a first electric cable and a first matching circuit. The first radio frequency wave may be employed in, e.g., generating a plasma or may be employed in other use (for example, ion attraction). Preferably, the inspecting the process performance is carried out while keeping the first radio frequency power supply turned off.

Preferably, the second electrode is attached to the processing vessel and is ungrounded. In such a case, when the plasma processing is performed in the plasma processing apparatus, a second radio frequency wave may be preferably supplied to the second electrode from a second radio frequency power supply via a second electric cable and a second matching circuit. Further, the inspecting the process performance may be carried out while keeping the second radio frequency power supply turned off.

Preferably, when the plasma processing is performed in the plasma processing apparatus, a first radio frequency wave lower than or equal to 13.56 MHz is supplied to the first electrode from a first radio frequency power supply via a first electric cable and a first matching circuit, and a second radio frequency wave higher than 13.56 MHz is supplied to a second electrode from a second radio frequency power supply via a second electric cable and the second matching circuit. In such a case, a target substrate is held on the first electrode. The second radio frequency wave of a relatively high frequency primarily contributes to plasma generation, while the first radio frequency wave of a relatively low frequency primarily contributes to ion attraction. The inspecting the process performance may be preferably carried out while keeping both the first and the second radio frequency power supply turned off.

Preferably, when the inspecting the process performance is carried out, the first matching circuit is separated from the rear surface of the first electrode, and, instead, an impedance measuring unit for measuring the impedance of the radio frequency transmission path is connected to the rear surface of the first electrode. If a radio frequency transmission conductor, e.g., a power feed rod is connected to the rear surface of the first electrode as a unit, the impedance measuring unit may be connected to the power feed rod.

The method for inspecting the process performance in accordance with the first aspect of the present invention may further includes: a fourth step of performing the first and the second step for each of N (N is an integer no smaller than 2) plasma processing apparatuses having a substantially same design and detecting the value of the property of the peak from each of the apparatuses; a fifth step of determining adequacy or inadequacy of the process performance based on data indicating a process state or a process result for each of the N apparatuses; and a sixth step of comparing the value of the property of the peak obtained by the fourth step and the determination results obtained by the fifth step, and setting a reference value for use in the third step of determining the adequacy or inadequacy of the process performance for other plasma processing apparatuses having the substantially same design as that of the N plasma processing apparatuses.

In the fifth step, a $V_{pp}$ determination method can be employed as a method for determining adequacy or inadequacy of the process performance based on data indicating a process state, for example.

In accordance with the method and apparatus of the present invention for inspecting a process performance, it is possible to simply determine whether the process performance would be good or bad in a capacitively coupled plasma processing apparatus, without generating a plasma or installing a jig on an electrode surface.

BRIEF DESCRIPTION OF THE DRAWINGS

The above features of the present invention will become apparent from the following description of an embodiment given in conjunction with the accompanying drawing, in which.

DETAILED DESCRIPTION OF THE EMBODIMENTS

Hereinafter, an embodiment of the present invention will now be described in detail with reference to the accompanying drawings, which form a part hereof.

Figure 1:
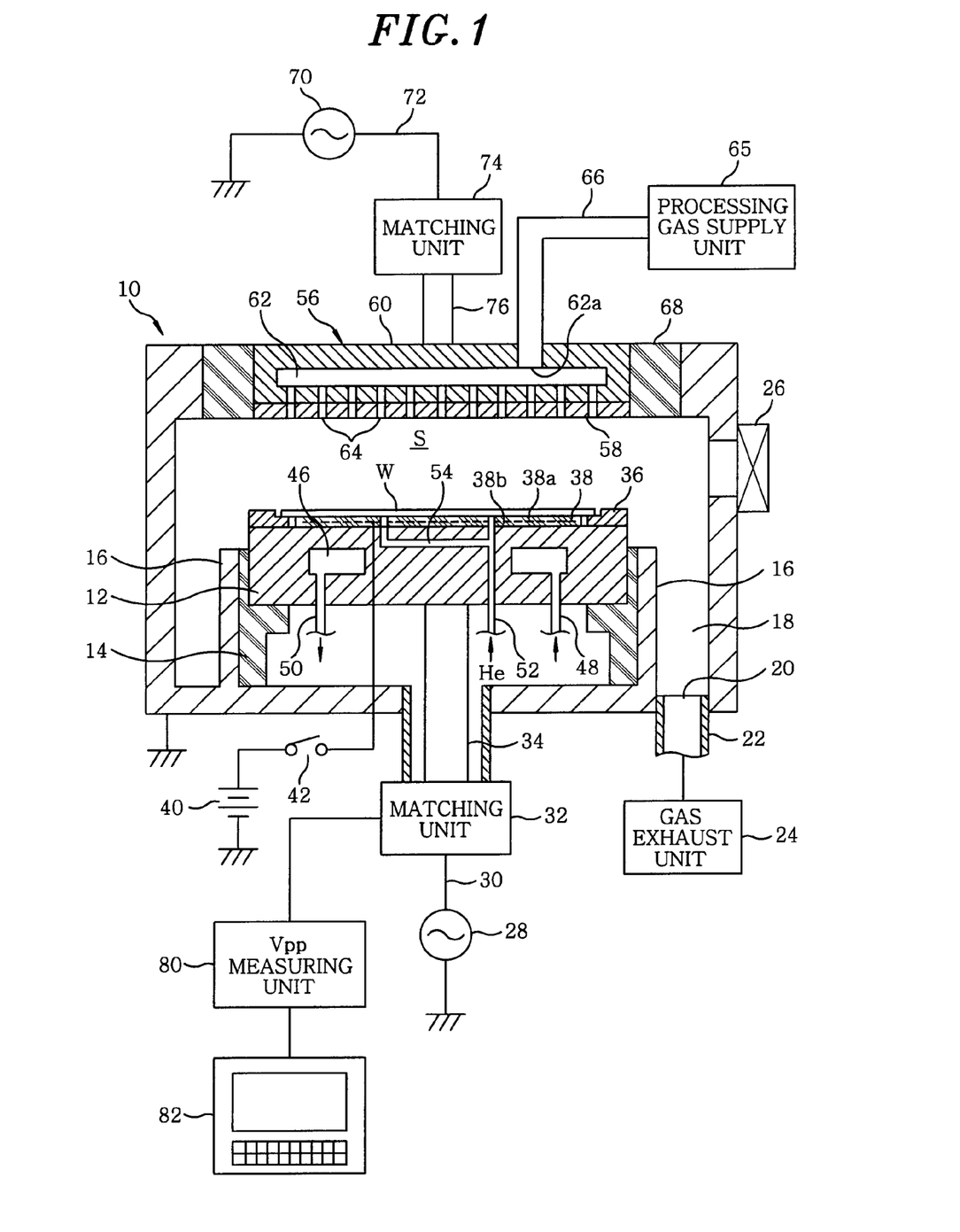
FIG. 1 is a longitudinal cross sectional view for describing a configuration of a capacitively coupled plasma etching apparatus in accordance with an embodiment of the present invention and a way to perform an inspection method referred to as a $V_{pp}$ determination method.

FIG. 1 illustrates a configuration of a plasma processing apparatus in accordance with an embodiment of the present invention. The plasma processing apparatus includes a capacitively coupled parallel plate type plasma etching apparatus and has, e.g., a cylindrical chamber (processing vessel) 10 made of a metal material such as aluminum, stainless steel or the like. The chamber 10 is frame grounded.

Horizontally disposed inside the chamber 10 is a disk shaped susceptor 12 serving as a lower electrode for mounting thereon a target substrate, e.g., a semiconductor wafer W. The susceptor 12 made of, e.g., aluminum is supported by a cylindrical insulating support 14 which is extended vertically upward from the bottom of the chamber 10 and made of, e.g., ceramic, and the susceptor 12 is thus not grounded. Further, along the periphery of the cylindrical insulating support 14, a cylindrical conductive support 16 is elongated vertically upward from the bottom of the chamber 10, and an annular exhaust passageway 18 is provided between an inner sidewall of the chamber 10 and the cylindrical conductive support 16. Further, a gas exhaust port 20 is provided at the bottom of the exhaust passageway 18. The gas exhaust port 20 is connected with a gas exhaust unit 24 via a gas exhaust line 22. The gas exhaust unit 24 has a vacuum pump such as a turbo molecular pump or the like and is able to depressurize a processing space in the chamber 10 to a desired vacuum level. A gate valve 26 for opening and closing a loading/unloading port for the semiconductor wafer W is installed at a sidewall of the chamber 10.

A first radio frequency power supply 28 is electrically connected to the susceptor 12 via a RF cable 30, a lower matching unit 32 and a lower power feed rod 34. Here, the first radio frequency power supply 28 outputs a first radio frequency power of a specific frequency, e.g., about 13.56 MHz, which primarily contributes to ion attraction to the semiconductor wafer W on the susceptor 12. The RF cable 30 is formed of, for example, a coaxial cable. The lower matching unit 32 accommodates therein a matching circuit which serves to match an impedance of the first radio frequency power supply 28 to that of a load side (mainly, electrode and plasma). The matching unit 32 further includes, e.g., a stepping motor, a controller and an RF sensor for auto-matching.

The susceptor 12 has a diameter or an aperture more larger than that of the semiconductor wafer W. A main surface, i.e., a top surface of the susceptor 12 is divided into two regions in a radial direction: a central portion referred to as a wafer mounting portion having a (circular) shape and a size substantially identical to those of the wafer W; and a peripheral portion present outside the wafer mounting portion and having an annular shape. The semiconductor wafer W is loaded on the wafer mounting portion, and a focus ring 36 having an inner diameter slightly larger than a diameter of the semiconductor wafer W is disposed on the annular peripheral portion. The focus ring 36 is made of one of, e.g., Si, SiC, C and $SiO_2$ depending on an etching target material of the semiconductor wafer W.

An electrostatic chuck 38 for attracting the wafer W is provided at the wafer mounting portion on the top surface of the susceptor 12. The electrostatic chuck 38 includes a film shaped or plate shaped dielectric 38a and a sheet shaped or a mesh shaped conductor 38b embedded in the dielectric 38a. The electrostatic chuck 38 is formed as one body on the top surface of the susceptor 12 or attached thereto as one body therewith. A DC power supply 40 disposed outside the chamber 10 is electrically connected to the conductor 38b via a wiring and a switch 42. The semiconductor wafer W is attracted to and held on the electrostatic chuck 38 by a Coulomb force generated by a DC voltage applied from the DC power supply 40.

Formed through the susceptor 12 is an annular coolant path 46 extending in, e.g., a circumferential direction. A coolant of a specific temperature, e.g., cooling water is circulated through the coolant chamber 46 from a chiller unit (not shown) via lines 48 and 50. By controlling the temperature of the coolant, the temperature of the semiconductor wafer W on the electrostatic chuck 38 can be controlled. Further, in order to improve a accuracy of the wafer temperature control, a thermally conductive gas, e.g., a helium (He) gas is supplied from a thermally conductive gas supply unit (not shown) to between the electrostatic chuck 38 and the semiconductor wafer W through a gas supply line 52 and a gas passage 54 inside the susceptor 12.

A shower head 56 serving as an upper electrode is provided at the ceiling of the chamber 10, while facing the susceptor 12 in parallel. The shower head 56 includes an electrode plate 58 facing the susceptor 12 and an electrode support 60 attachably and detachably supporting the electrode plate 58 from the backside thereof (from on top thereof). The electrode support 60 has a gas chamber 62 therein, and a number of gas discharge holes 64 perforated from the gas chamber 62 toward the susceptor 12 are formed through the electrode support 60 and the electrode plate 58. A space S between the electrode plate 58 and the susceptor 12 is a plasma generation space or a processing space. A gas supply line 66 from a processing gas supply unit 65 is connected to a gas inlet port 62a provided at an upper portion of the gas chamber 62. The electrode plate 58 is made of, e.g., Si, SiC or C, and the electrode support 60 is made of, e.g., alumite treated aluminum.

An annular insulator 68 formed of, e.g., alumina is airtightly interposed between the shower head 56 and a peripheral portion of a top surface opening of the chamber 10, and the shower head 56 is attached to the chamber 10 and is not grounded. A second radio frequency power supply 70 is electrically connected to the shower head 56 via a RF cable 72, an upper matching unit 74 and an upper power feed rod 76. Here, the second radio frequency power supply 70 outputs a second radio frequency power of a specific frequency, e.g., about 60 MHz, which primarily contributes to a plasma generation. The RF cable 72 is made of, e.g., a coaxial cable. The matching unit 74 accommodates therein a matching circuit which serves to match an impedance of the radio frequency power supply 70 to that of a load side (mainly, electrode and plasma). The matching unit 74 further includes, e.g., a stepping motor, a controller and an RF sensor for auto-matching.

An operation of each component of the plasma processing apparatus including, e.g., the gas exhaust unit 24, the radio frequency power supplies 28 and 70, the switch 42 of the DC power supply 40, the chiller unit (not shown), the thermally conductive gas supply unit (not shown), the processing gas supply unit 65 and the like and a whole operation (sequence) of the apparatus are controlled by an etcher controller (not shown) having a microcomputer, for example.

To perform an etching process in this plasma etching apparatus, a gate valve 26 is first opened, and a semiconductor wafer W to be processed is loaded into the chamber 10 and mounted on the electrostatic chuck 38. Then, an etching gas (generally, a gaseous mixture) is introduced into the chamber 10 at a specific flow rate with a certain flow rate ratio, and the inner pressure of the chamber 10 is regulated at a set valve by the gas exhaust unit 24. Further, the first and the second radio frequency power supply 28 and 70 are turned on, so that the first radio frequency power (13.56 MHz) and the second radio frequency power (60 MHz) are outputted at certain output powers.

The first radio frequency power is supplied to the susceptor (lower electrode) 12 via the RF cable 30, the matching unit 32 and the power feed rod 34, while the second radio frequency power is supplied to the shower head (upper electrode) 56 via the RF cable 72, the matching unit 74 and the power feed rod 76. Further, by turning on the switch 42, the thermally conductive gas (He gas) is effectively confined at a contact interface between the electrostatic chuck 38 and the semiconductor wafer W by the electrostatic adsorptive force. The etching gas discharged from the shower head 56 is converted into a plasma by a radio frequency discharge between the two electrodes 12 and 56, and films on the main surface of the semiconductor wafer W are etched by radicals or ions generated from the plasma.

By applying the second radio frequency wave of a relatively high frequency 60 MHz suitable for plasma generation to the shower head 56, this capacitively coupled plasma etching apparatus can increase the density of the plasma in an appropriately dissociated state. Thus, a high-density plasma can be generated under a low pressure condition. Further, by applying the first radio frequency wave of a relatively low frequency 13.56 MHz suitable for ion attraction to the susceptor 12, this plasma etching apparatus can perform anisotropic etching with a high selectivity for the semiconductor wafer W on the susceptor 12. Generally, in this type of apparatus in which waves of different frequencies are respectively applied to the upper and the lower electrode, a radio frequency wave of a frequency less than or equal to about 13.56 MHz is preferably applied to the susceptor (lower electrode) 12, while a radio frequency wave of a frequency higher than about 13.56 MHz is preferably applied to the shower head (upper electrode) 56.

In this plasma etching apparatus, an etching rate, which is an important indicator of a process performance for example, can be obtained by measuring an etching amount in an actual process and dividing the etching amount by an etching time. In such a case, if the measurement value of the etching rate is near a specific reference value, the process or the process performance may be determined to be normal (good), whereas if the measurement value of the etching rate is much lower than the reference value, the process or the process performance may be determined to be abnormal (bad).

Further, as a process performance inspection or monitoring method simpler than the above-mentioned etching rate measurement method, there has been known a method ($V_{pp}$ determination method) for monitoring an amplitude value or a peak-to-peak value $V_{pp}$ of a first radio frequency voltage applied to an RF electrode, e.g., the first radio frequency voltage applied to the susceptor (lower electrode) 12. Generally, the $V_{pp}$ of the RF voltage applied to the RF electrode of the plasma processing apparatus is proportional to a DC-bias or self-bias voltage generated in that RF electrode, and, besides, it corresponds to the magnitude of incident ion energy. Accordingly, if a $V_{pp}$ measurement value is near a certain reference value, it may be determined that the process performance is normal (good). Further, if the $V_{pp}$ measurement value is much lower than the reference value, it may be determined that the process performance is abnormal (bad).

When performing such $V_{pp}$ determination method, a $V_{pp}$ measuring unit 80 shown in FIG. 1 is used. A probe terminal of the $V_{pp}$ measuring unit 80 is electrically connected to an output terminal of the matching unit 32 so that a peak-to-peak value of an output voltage of the matching unit 32 is measured as the $V_{pp}$ of the lower RF voltage. The $V_{pp}$ measurement value obtained by the $V_{pp}$ measuring unit 80 is inputted to an inspection apparatus 82 made of, e.g., a personal computer as monitoring data for use in inspecting the process performance.

Though the aforementioned $V_{pp}$ measurement method does not require measuring an etching amount by performing an etching process, it is still required to actually ignite or generate a plasma by way of operating each component of the plasma etching apparatus, particularly, the first and the second radio frequency power supply 28 and 70, the gas exhaust unit 24 and the processing gas supply unit 65. Thus, this method is not easily executable when shipping the apparatus or installing the apparatus at a target place.

A processing inspection method in accordance with an embodiment of the present invention is capable of determining whether the process performance would be good or bad, without having to generate a plasma in a target apparatus as will be described below. Therefore, the present method can be readily performed when shipping the apparatus or installing the apparatus at the target place. Besides, since a measuring jig is not brought into contact with the front surfaces of the RF electrodes 12 and 56 during the inspection, the electrodes can be protected, and particles are prevented from being generated.

Figure 2:
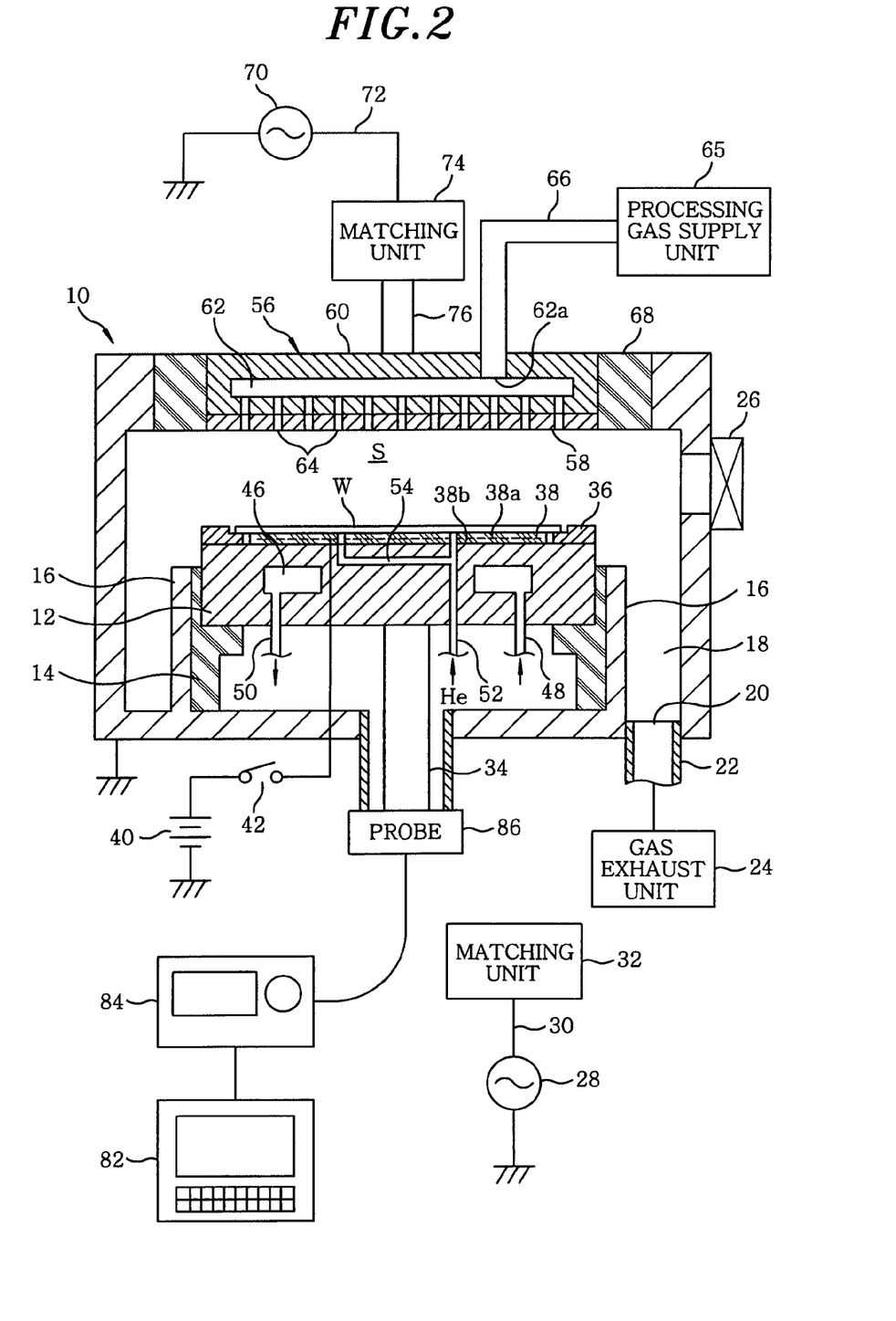
FIG. 2 sets forth a longitudinal cross sectional view for describing a way to perform a real resistance component peak inspection method in accordance with the embodiment of the present invention.

FIG. 2 describes an exemplary process performance inspection method in accordance with the embodiment of the present invention. As illustrated in FIG. 2, for the process performance inspection method, the lower matching unit 32 is separated from the lower power feed rod 34, and a probe (measuring jig) 86 of a frequency sweepable impedance measuring unit 84 made up of an impedance analyzer or a network analyzer is connected to the lower power feed rod 34. Then, the impedance measuring unit 84 measures an impedance of a radio frequency transmission path ranging from the rear surface of the susceptor 12 to the ground potential while maintaining each component of the plasma processing apparatus, particularly, the first and the second radio frequency power supply 28 and 70, the gas exhaust unit 24 and the processing gas supply unit 65, in off states. The inspection apparatus 82 controls the impedance measuring unit 84 to sweep a frequency within a specific range, thus acquiring a frequency characteristic of a real resistance component of the impedance of the radio frequency transmission path.

Here, the radio frequency transmission path, which is the target of the impedance measurement, includes a first route of the lower power feed rod 34→the susceptor 12→the cylindrical insulating support 14→the chamber 10; a second route of the lower power feed rod 34→the susceptor 12→the space S→the chamber 10; a third route of the lower power feed rod 34→the susceptor 12→the space S→the shower head (upper electrode) 56→the upper power feed rod 76→the upper matching unit 74→the ground; and a fourth route of the lower power feed rod 34→the susceptor 12→the space S→the shower head 56→the upper power feed rod 76→the upper matching unit 74→the RF cable 72→the ground.

Figure 3:
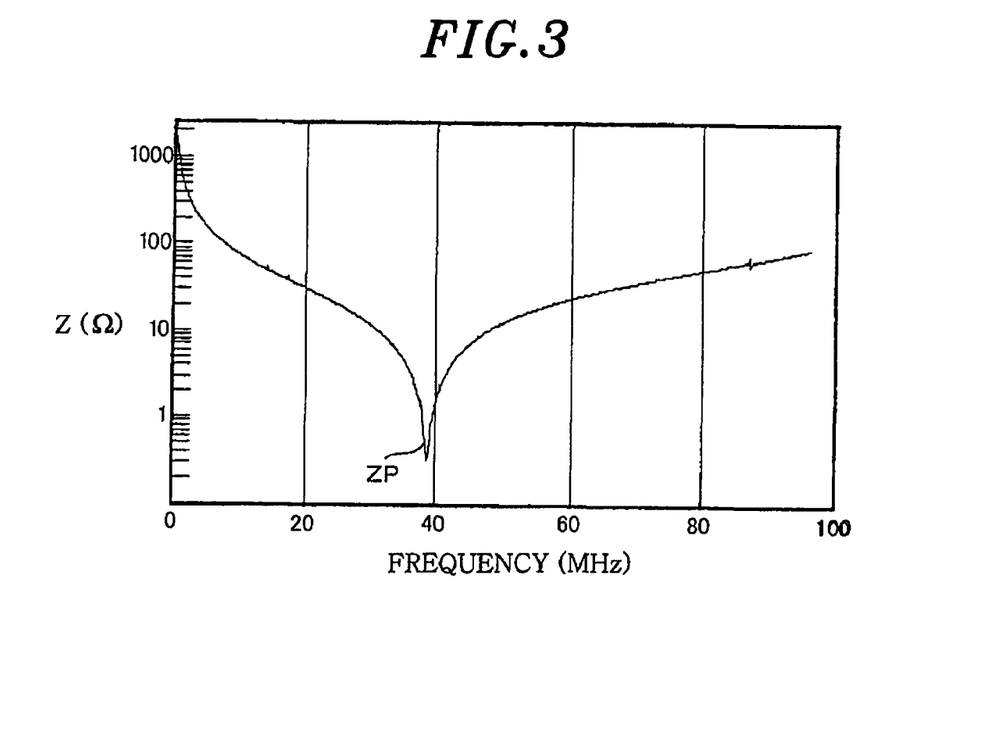
FIG. 3 provides a chart showing a frequency characteristic of an impedance absolute value obtained by the real resistance component peak inspection method in accordance with the embodiment of the present invention.
Figure 4:
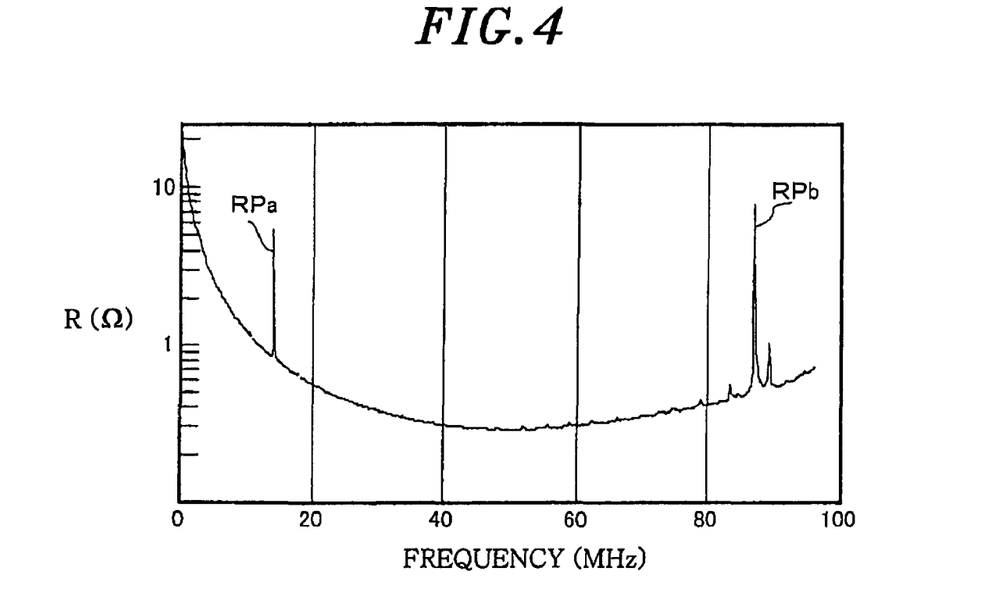
FIG. 4 depicts a chart showing a frequency characteristic of an impedance real resistance component (real part) obtained by the real resistance component peak inspection method in accordance with the embodiment of the present invention.

FIGS. 3 and 4 show a frequency characteristic of an absolute value Z of the impedance (expressed by a complex number) of the radio frequency transmission path and a frequency characteristic of the real resistance component (real part) R, which are obtained by the impedance measuring unit 84.

As shown in FIG. 3, the frequency characteristic of the impedance absolute value Z of the radio frequency transmission path forms a serial resonance curve having a minimum peak ZP near a frequency of 39 MHz. Such serial resonance is generated by a serial circuit made up of an inductance $L_{34}$ of the lower power feed rod 34 and a capacitance $C_{14}$ of the cylindrical insulating support (dielectric) 14 of the susceptor 12 in the first route. As for the frequency characteristic of the impedance absolute value Z, a frequency characteristic of the first route appears dominantly or substantially entirely, while frequency characteristics of the other routes, particularly, the third route or the fourth route including the radio frequency transmission path of the shower head (upper electrode) 56 side, hardly appear.

Meanwhile, as shown in FIG. 4, the frequency characteristic of the real resistance component (real part) of the impedance of the radio frequency transmission path forms a gentle curve protruding downward as a whole, wherein horn-like peaks $RP_a$ and $RP_b$ appear near a frequency of 13 to 14 MHZ and a frequency of 86 to 87 MHz, respectively. These peaks RP of the frequency characteristic of the real resistance component are known to be generated due to a parallel resonance in the third or the fourth route. For example, in the shown example, the peak $RP_a$ is created due to an occurrence of a parallel resonance which depends on a circuit configuration or a circuit constant of the upper matching unit 74. Further, the peak $RP_b$ is created due to an occurrence of a parallel resonance which depends on the length of the RF cable 72. During the parallel resonance, the real resistance component (real part) of the impedance has a very high value and can be seen from the backside of the opposing electrode (susceptor 12) via the electrode gap space S.

As described, if a parallel resonance occurs on the radio frequency transmission path at the front (or back) side of the shower head (upper electrode) 56 in the third or the fourth route, such parallel resonance is reflected on the frequency characteristic of the real resistance component R, and the impedance measuring unit 84 detects it as a horn-like peak. In case of the frequency characteristic of the impedance absolute value Z (see FIG. 3), the parallel resonance in the third or the fourth route is hardly reflected, and it is impossible to detect it.

The present inventor has repeated many experiments and researches, and proved that the horn-like peaks among the frequency characteristic of the real resistance component R of the impedance of the above-described radio frequency transmission path are deeply relevant to mechanical differences on an impedance of a subject radio frequency transmission path between plural apparatuses which have substantially same design and, besides, they can be the indicators of the process performance of each apparatus showing whether it would be good or bad.

In a first example, the present inventor installed seven upper matching units 74A, 74B, 74C, 74D, 74E, 74F and 74G, which have the same design, to a single plasma etching apparatus having the same configuration as that shown in FIG. 1, wherein the plasma etching apparatuses with the respective upper matching units are regarded as apparatuses A to G; and the $V_{pp}$ determination method described in FIG. 1 and the real resistance component peak inspection method in accordance with the present embodiment described in FIG. 2 were alternately performed for each apparatus. The results are shown in FIGS. 5 to 7.

Figure 5:
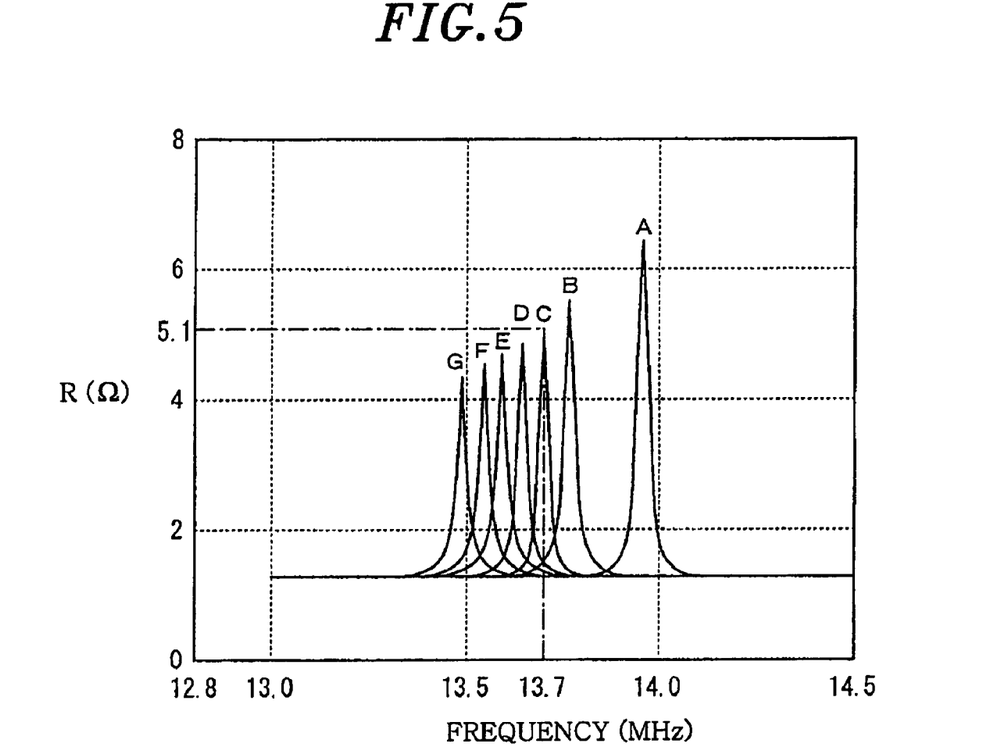
FIG. 5 presents a chart for comparing horn-like peaks of real resistance components, which are respectively detected from a plurality of apparatuses, on a same frequency axis in accordance with the embodiment of the present invention.

FIG. 5 shows and compares horn-like peaks $RP_a$ generated around a frequency of 13 to 14 MHz among frequency characteristics of real resistance components obtained from the respective apparatuses A to G. As shown in the drawing, in comparison with the frequencies where the peaks appear, there are found differences (mechanical differences) between the apparatuses: the frequency of the apparatus A was highest, and those of the apparatuses B to G became lower in that sequence.

Figure 6:
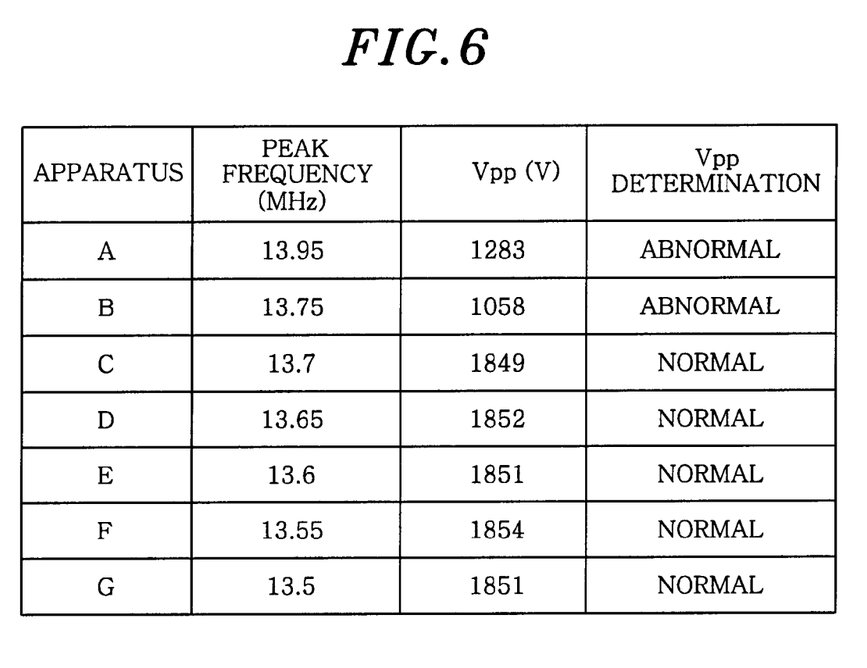
FIG. 6 offers a table for comparing results of the $V_{pp}$ determination method and the real resistance component peak inspection method in accordance with the embodiment of the present invention.
Figure 7:
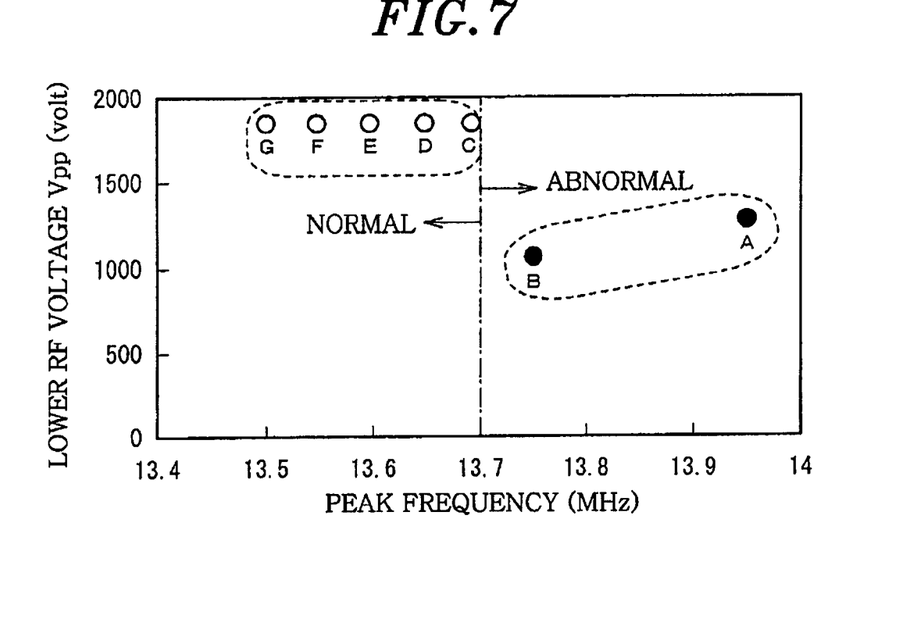
FIG. 7 is a mapping diagram of a peak frequency and a lower RF voltage $V_{pp}$.

FIG. 6 provides a table showing a relationship between $V_{pp}$ measurement value of a lower RF voltage and a $V_{pp}$ determination result obtained by the $V_{pp}$ determination method, and a peak frequency obtained by the real resistance component peak inspection method in accordance with the present embodiment. As shown in the table, according to the $V_{pp}$ determination method, $V_{pp}$ measurement values of the apparatuses C, D, E, F G were 1849 V, 1852 V, 1851 V, 1854 V and 1851 V, respectively, and these values are within a narrow voltage range from 1849 V to 1854 V. In contrast, $V_{pp}$ measurement values of the apparatuses A and B were 1283 V and 1058 V, respectively, and these values are much lower than (almost half of) those of the apparatuses C to G. It was concluded that the process performance of each of the apparatuses C to G was normal, while the process performance of each of the apparatuses A and B was abnormal.

Meanwhile, according to the real resistance component peak inspection method in accordance with the present embodiment, peak frequencies of the apparatuses C, D, E, F, and G were 13.7 MHz, 13.65 MHz, 13.6 MHz, 13.55 MHZ, and 13.5 MHZ, respectively, and they were all no greater than 13.7 MHz. In contrast, peak frequencies of the apparatuses A and B were 13.95 MHz and 13.75 MHz, respectively, both of which were higher than 13.7 MHz. That is, the apparatuses C to G whose process performances were found to be normal (good) and the apparatuses A and B whose process performances were found to be abnormal (bad) by the $V_{pp}$ determination method can also be divided into two groups with respect to the frequency level of about 13.7 MHz on the axis of the peak frequency detected by the real resistance component peak inspection method of the present embodiment: one is a group whose peak frequency is no greater than 13.7 MHz and the other is a group whose peak frequency is greater than 13.7 MHZ. This division or grouping can be clearly understood from the mapping of a peak frequency and the lower RF voltage $V_{pp}$ shown in FIG. 7.

From the experiment results described above, a determination method can be deducted as follows. As for apparatuses H, I, J, . . . having the same design as that of the apparatuses A to G, more precisely, the apparatuses H, I, J, . . . including upper matching units 74H, 74I, 74J, . . . fabricated by the same design as that of the upper matching units 74A to 74G, it is not necessary to perform the $V_{pp}$ determination method for the inspection of their process performance, but it is possible to determine whether the process performance would be good or bad based on peak frequencies obtained by the real resistance component peak inspection method in accordance with the present embodiment.

Figure 8:
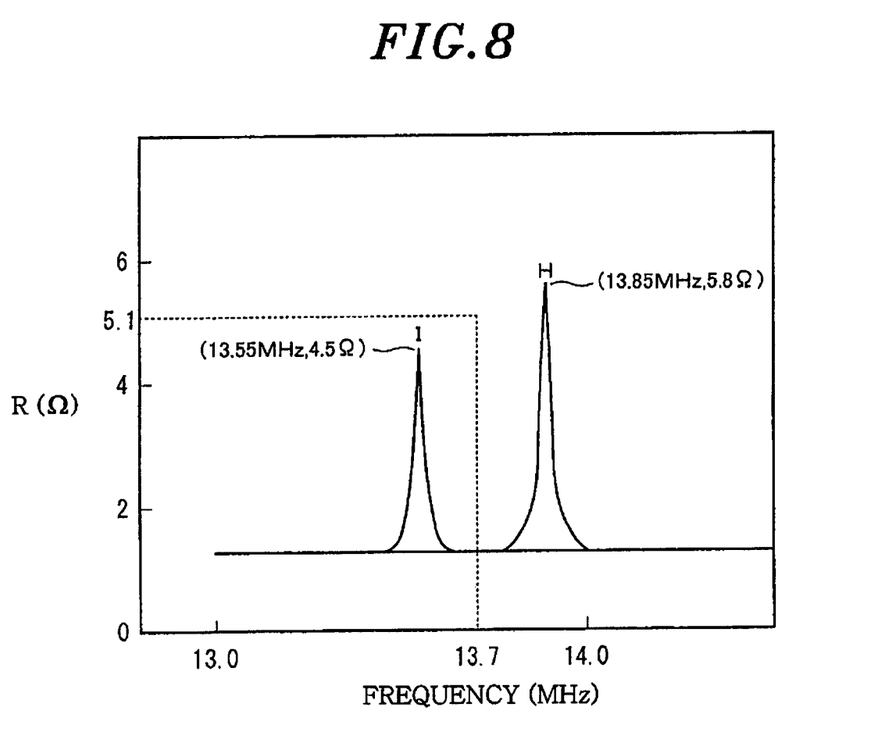
FIG. 8 provides a chart for describing an example of determining whether the process performance would be good or bad based on the real resistance component peak inspection method in accordance with the embodiment of the present invention.

Accordingly, as illustrated in FIG. 8, if a peak frequency read from, e.g., the apparatus H by the real resistance component peak inspection method is 13.85 MH, the process performance of the apparatus H can be determined to be abnormal or bad because its peak frequency is higher than a reference value (13.7 MHz). Further, if a peak frequency read from, e.g., the apparatus I by the real resistance component peak inspection method is 13.55 MHz, the process performance of the apparatus I can be determined to be normal or good because its peak frequency is lower than the reference value (13.7 MHz).

The above-described data interpretation, determination reference and determination algorithm can be all embedded in a program of the inspection apparatus. Further, in order to obtain the determination reference of the process performance (reference to determine whether it is good or not), it is possible to use data (e.g., an etching rate, an etching uniformity, an aspect ratio, and the like) of actual process results, instead of the data of the inspection result by the $V_{pp}$ determination method.

In the real resistance component peak inspection method, it is also possible to select a peak value (instead of the peak frequency) as a peak property of a determination parameter and to determine the process performance based on the peak value. That is, as shown in FIG. 5, the normal (good) apparatuses C to G and the abnormal (bad) apparatuses A and B are divided into two groups with respect to a peak value of 5.1Ω which is readable by the real resistance component peak inspection method in accordance with the present embodiment.

Accordingly, if a peak value read from, e.g., the apparatus H is 5.8Ω as shown in FIG. 8, the process performance of the apparatus H can be determined to be abnormal (bad) because its peak value is higher than a reference value (5.1Ω). Further, if a peak value read from, e.g., the apparatus I by the real resistance component peak inspection method is 4.5Ω, the process performance of the apparatus I can be determined to be normal (good) because its peak value is lower than the reference value (5.1Ω).

Further, both the peak frequency and the peak value can be selected as the peak property of the determination parameter. In such case, it is possible to determine the adequacy or inadequacy of the process performance based on both of the peak frequency and the peak value by the determination algorithm described above. Moreover, though the present embodiment described above uses only the horn-like peak $RP_a$ occurring at the frequency range of 13 to 14 MHz, a horn-like peak occurring at a different frequency rage (e.g., the horn-like peak $RP_b$ in FIG. 4) can also be used as the determination parameter.

Furthermore, in case the inspection apparatus 82 outputs a determination result that the process performance is abnormal (bad), it is preferable to adjust the impedance of the radio frequency transmission system of the third or the fourth route so as to obtain a determination result indicating that the process performance is normal (good) when reinspecting. For example, the circuit configuration or the circuit constant of the matching unit 74, or the length of the RF cable 72 can be preferably adjusted.

In the embodiment of the present invention, by connecting the impedance measuring unit 84 to the rear surface of the susceptor (lower electrode) 12, a mechanical difference on an impedance of a radio frequency transmission path on the side of the shower head (upper electrode) 56, which functions as a RF electrode opposite to the susceptor 12, is monitored by using a real resistance component peak inspection method. As another embodiment (not shown), it is possible to connect the impedance measuring unit 84 to the rear surface of the shower head (upper electrode) 56, and monitor, by using the real resistance component peak inspection method, a mechanical difference on an impedance of a radio frequency transmission path at the side of the susceptor (lower electrode) 12 which functions as a RF electrode opposite to the shower head 56.

The present invention is not limited to the plasma processing apparatus of the type in which radio frequency waves of difference frequencies are respectively applied to the upper electrode and the lower electrode. For example, the present invention can also be applied to a capacitively coupled plasma processing apparatus of a type in which a single frequency power or dual frequency powers of different frequencies are applied to either one of the upper and the lower electrode.

The present invention is not limited to the plasma etching but can be applied to other types of plasma processings such as plasma CVD, plasma oxidation, plasma nitrification, sputtering and the like. Furthermore, the target substrate in the present embodiment is not limited to the semiconductor wafer, but various substrates for a flat panel display, a photomask, a CD substrate, a printed circuit board, and the like can be utilized.

While the invention has been shown and described with respect to the embodiments, it will be understood by those skilled in the art that various changes and modifications may be made without departing from the scoped of the invention as defined in the following claims.

What is claimed is:

1. A method for inspecting a process performance of a capacitively coupled plasma processing apparatus which generates a plasma for a plasma processing by applying a radio frequency wave between a first electrode attached to a depressurizable processing vessel and a second electrode disposed in the processing vessel to face the first electrode in parallel, the first electrode being ungrounded, the method comprising:
   a first step of measuring an impedance of a radio frequency transmission path ranging from a rear surface of the first electrode to a ground potential part and sweeping a frequency to thereby obtain a frequency characteristic of a real resistance component of the impedance;
   a second step of reading a value of a specific property of a peak which appears from the frequency characteristic of the real resistance component; and
   a third step of determining adequacy or inadequacy of the process performance of the plasma processing apparatus based on the value of the property of the peak.

2. The inspection method of claim 1, wherein the property of the peak is a frequency where the peak appears.

3. The inspection method of claim 1, wherein the property of the peak is a value of the peak.

4. The inspection method of claim 1, wherein when the plasma processing is performed in the plasma processing apparatus, a first radio frequency wave is supplied to the first electrode from a first radio frequency power supply via a first electric cable and a first matching circuit.

5. The inspection method of claim 4, wherein the inspecting the process performance is carried out while keeping the first radio frequency power supply turned off.

6. The inspection method of claim 1, wherein the second electrode is attached to the processing vessel and is ungrounded.

7. The inspection method of claim 6, wherein when the plasma processing is performed in the plasma processing apparatus, a second radio frequency wave is supplied to the second electrode from a second radio frequency power supply via a second electric cable and a second matching circuit.

8. The inspection method of claim 7, wherein the inspecting the process performance is carried out while keeping the second radio frequency power supply turned off.

9. The inspection method of claim 6, wherein when the plasma processing is performed in the plasma processing apparatus, a first radio frequency wave lower than or equal to 13.56 MHz is supplied to the first electrode from a first radio frequency power supply via a first electric cable and a first matching circuit, and a second radio frequency wave higher than 13.56 MHz is supplied to a second electrode from a second radio frequency power supply via a second electric cable and the second matching circuit.

10. The inspection method of claim 9, wherein the inspecting the process performance is carried out while keeping both the first and the second radio frequency power supply turned off.

11. The inspection method of claim 10, wherein a target substrate is held on the first electrode.

12. The inspection method of claim 4, wherein when the inspecting the process performance is carried out, the first matching circuit is separated from the rear surface of the first electrode, and, instead, an impedance measuring unit for measuring the impedance of the radio frequency transmission path is connected to the rear surface of the first electrode.

13. The inspection method of claim 9, wherein when the inspecting the process performance is carried out, the first matching circuit is separated from the rear surface of the first electrode, and, instead, an impedance measuring unit for measuring the impedance of the radio frequency transmission path is connected to the rear surface of the first electrode.

14. The inspection method of claim 1, further comprising:
- a fourth step of performing the first and the second step for each of N (N is an integer no smaller than 2) plasma processing apparatuses having a substantially same design and detecting the value of the property of the peak from each of the apparatuses;
- a fifth step of determining adequacy or inadequacy of the process performance based on data indicating a process state or a process result for each of the N apparatuses; and
- a sixth step of comparing the value of the property of the peak obtained by the fourth step and the determination results obtained by the fifth step, and setting a reference value for use in the third step of determining the adequacy or inadequacy of the process performance for other plasma processing apparatuses having the substantially same design as that of the N plasma processing apparatuses.

15. An apparatus for inspecting a process performance of a capacitively coupled plasma processing apparatus which generates a plasma for a plasma processing by applying a radio frequency wave between a first electrode attached to a depressurizable processing vessel and a second electrode disposed in the processing vessel to face the first electrode in parallel, the first electrode being ungrounded, the apparatus comprising:
- an impedance measuring unit for measuring an impedance of a radio frequency transmission path ranging from a rear surface of the first electrode to a ground potential part;
- a real resistance component frequency characteristic acquiring unit for acquiring a frequency characteristic of a real resistance component of the impedance by allowing the impedance measuring unit to measure the impedance of the radio frequency transmission path while sweeping a frequency;
- a peak reading unit for reading a value of a specific property of a peak which appears from the frequency characteristic of the real resistance component; and
- a determination unit for determining adequacy or inadequacy of the process performance of the plasma processing apparatus based on the value of the property of the peak.

* * * * *